US011062890B1

(12) United States Patent
Yamaguchi et al.

(10) Patent No.: US 11,062,890 B1
(45) Date of Patent: Jul. 13, 2021

(54) PHOTOCATHODES WITH AN ENHANCEMENT LAYER AND METHOD OF MAKING THE SAME

(71) Applicant: TRIAD NATIONAL SECURITY, LLC, Los Alamos, NM (US)

(72) Inventors: Hisato Yamaguchi, Los Alamos, NM (US); Nathan Andrew Moody, Los Alamos, NM (US); Fangze Liu, Los Alamos, NM (US)

(73) Assignee: Triad National Security, LLC, Los Alamos, NM (US)

( * ) Notice: Subject to any disclaimer, the term of this patent is extended or adjusted under 35 U.S.C. 154(b) by 0 days.

(21) Appl. No.: 16/840,187

(22) Filed: Apr. 3, 2020

Related U.S. Application Data

(60) Provisional application No. 62/830,221, filed on Apr. 5, 2019.

(51) Int. Cl.
*H01J 40/06* (2006.01)
*H01L 33/06* (2010.01)
*H01L 33/56* (2010.01)
*H01J 9/12* (2006.01)

(52) U.S. Cl.
CPC ............... *H01J 40/06* (2013.01); *H01J 9/12* (2013.01); *H01L 33/06* (2013.01); *H01L 33/56* (2013.01)

(58) Field of Classification Search
CPC .... H01J 1/34; H01J 40/06; H01J 33/06; H01J 9/12
See application file for complete search history.

(56) References Cited

U.S. PATENT DOCUMENTS

| | | | | |
|---|---|---|---|---|
| 10,354,828 | B1* | 7/2019 | Moody | ............... H01J 9/12 |
| 2013/0293100 | A1* | 11/2013 | Moody | ............... H01J 40/06 |
| | | | | 313/542 |

OTHER PUBLICATIONS

John Hemminger et al., Directing Matter and Energy: Five Challenges for Science and the Imagination, A Report from the Basic Energy Science Advisory Committee, Dec. 20, 2007, 144 Pages, U.S. Department of Energy, U.S.
Harriet Kung, Basic Energy Sciences 2011 Summary Report, 2011, 52 Pages, U.S. Department of Energy of Science, U.S.
D.H. Dowell et al., Cathode R&D for future light sources, Nuclear Instruments and Methods in Physics Research A, 2010, pp. 685-697, vol. 622, Elsevier B.V., Netherlands.
William A. Barletta et al., Workshop Summary: Accelerator Physics for Future Light Sources, BESAC Meeting Nov. 5, 2009, 2009, 36 Pages, U.S. Department of Energy, U.S.
Wolfgang Eberhardt et al., Next-Generation Photon Sources for Grand Challenges in Science and Energy, Report of the Workshop on Solving Science and Energy Grand Challenges with Next-Generation Photon Sources, May 2009, 133 Pages, A Report of a Subcommittee to the Basic Energy Sciences Advisory Committee U.S. Department of Energy, U.S.

(Continued)

*Primary Examiner* — Joseph L Williams
(74) *Attorney, Agent, or Firm* — Lewis Roca Rothgerber Christie LLP

(57) ABSTRACT

A photocathode assembly may include: a reflective substrate; an enhancement layer on the reflective substrate; and a photosensitive film on the enhancement layer, wherein the enhancement layer has a thickness of about 10 nm or less.

20 Claims, 9 Drawing Sheets
(6 of 9 Drawing Sheet(s) Filed in Color)

(56) References Cited

OTHER PUBLICATIONS

Graham R. Fleming et al., Grand challenges in basic energy sciences, Physics Today, Jul. 2008, pp. 28-33, vol. 61, No. 7, American Institute of Physics, U.S.
Walter Henning et al., Accelerators for America's Future, U.S. Department of Energy's Office of High Energy Physics symposium and workshop, Oct. 2009, 100 Pages, U.S. Department of Energy, U.S.
William A. Barletta et al., Report of the Basic Energy Sciences Workshop on Compact Light Sources, May 11-12, 2010, 63 Pages, U.S. Department of Energy Office of Science, U.S.
Fangze Liu et al., Single layer graphene protective gas barrier for copper photocathodes, Applied Physics Letter, 2017, pp. 041607-1 to 041607-4, vol. 110, No. 041607, Applied Physics Letters, U.S.
Hisato Yamaguchi et al., Active bialkali photocathodes on free-standing graphene substrates, npj | 2D Materials and Applications, 2017, vol. 1:12, 9 Pages, Published in partnership with FCT NOVA with the support of E-MRS, U.S.
L. Guo et al., Substrate dependence of $CsK_2Sb$ photo-cathode performance, Progress of Theoretical and Experimental Physics, Mar. 31, 2017, 10 Pages, Oxford University Press, U.K. Website: https://academic.oup.com/ptep/article/2017/3/033G01/3096765.
Anna Alexander et al., Enhanced photocathode performance through optimization of film thickness and substrate, J. Vac. Sci. Technol. B, Mar./Apr. 2017, pp. 022202-1 to 022202-5, vol. 35, No. 2, American Vacuum Society, U.S.
Anna Alexander et al., Enhanced quantum efficiency of photoelectron emission, through surface textured metal electrodes, J. Vac. Sci. Technol. A, Mar./Apr. 2016, pp. 021401-1 to 021401-5, vol. 34, No. 2, American Vacuum Society, U.S.
Jannik C. Meyer et al., The structure of suspended graphene sheets, Nature, Mar. 1, 2017, 4 pages, vol. 446, Nature Publishing Group.
Guohong Li et al., Scanning Tunneling Spectroscopy of Graphene on Graphite, Physical Review Letters, May 1, 2009, pp. 176804-1 to 176804-4, vol. 102, The American Physical Society, U.S.
Sukang Bae et al., Roll-to-roll production of 30-inch graphene films for transparent electrodes, Letters Nature Nanotechnology, Aug. 2010, pp. 574-578, vol. 5, Macmillan Publishers Limited, U.S.
Changgu Lee et al., Measurement of the Elastic Properties and Intrinsic Strength of Monolayer Graphene, Science, Jul. 18, 2018, pp. 385-388, vol. 321, No. 5887, Science Magazine, U.S.
Alfonso Reina et al., Large Area, Few-Layer Graphene Films on Arbitrary Substrates by Chemical Vapor Deposition, Nano Letters, 2009, pp. 30-35, vol. 9, No. 1, American Chemical Society, U.S.
Li Song, et al., Large Scale Growth and Characterization of Atomic Hexagonal Boron Nitride Layers, Nano Letters, 2010, pp. 3209-3215, vol. 10, American Chemical Society, U.S.
A.K. Geim et al., The rise of graphene, Progress Article, Nature Materials, Mar. 2007, pp. 183-191, vol. 6, Nature Publishing Group.
Alexander A. Balandin et al., Superior Thermal Conductivity of Single-Layer Graphene, Nano Letters, 2008, pp. 902-907, vol. 8, No. 3., American Chemical Society, U.S.
Xuesong Li et al., Large-Area Synthesis of High-Quality and Uniform Graphene Films on Copper Foils, Science, Jun. 5, 2009, pp. 1312-13-1312-14, vol. 324, Science Magazine, U.S.
Hisato Yamaguchi et al., Reduced Graphene Oxide Thin Films as Ultrabarriers for Organic Electronics, Advanced Energy Materials, 2014, 6 Pages, vol. 4, No. 1300986, WILEY-VCH Verlag GmbH & Co. KGaA, Weinheim, Germany.
K.S. Novoselov et al., A roadmap for graphene, Nature, Oct. 11, 2012, pp. 192-200, vol. 490, Macmillan Publishers Limited, U.S.
A.C. Ferrari et al., Raman Spectrum of Graphene and Graphene Layers, Physical Review Letters, Nov. 3, 2006, pp. 187401-1 to 187401-4, vol. 97, The American Physical Society, U.S.
A.K. Geim et al., Graphene: Status and Prospects, Science, Jun. 19, 2009, pp. 1530-1534, vol. 324, Science Magazine, U.S.
Kian Ping Loh et al., The chemistry of graphene, Journal of Materials Chemistry, 2010, pp. 2277-2289, vol. 20, The Royal Society of Chemistry, U.K.
Hisato Yamaguchi et al., Free-Standing Bialkali Photocathodes Using Atomically Thin Substrates, Advanced Materials Interfaces, 2018, 9 Pages, No. 1800249, WILEY-VCH Verlag GmbH & Co. KGaA, Weinheim, Germany.

* cited by examiner

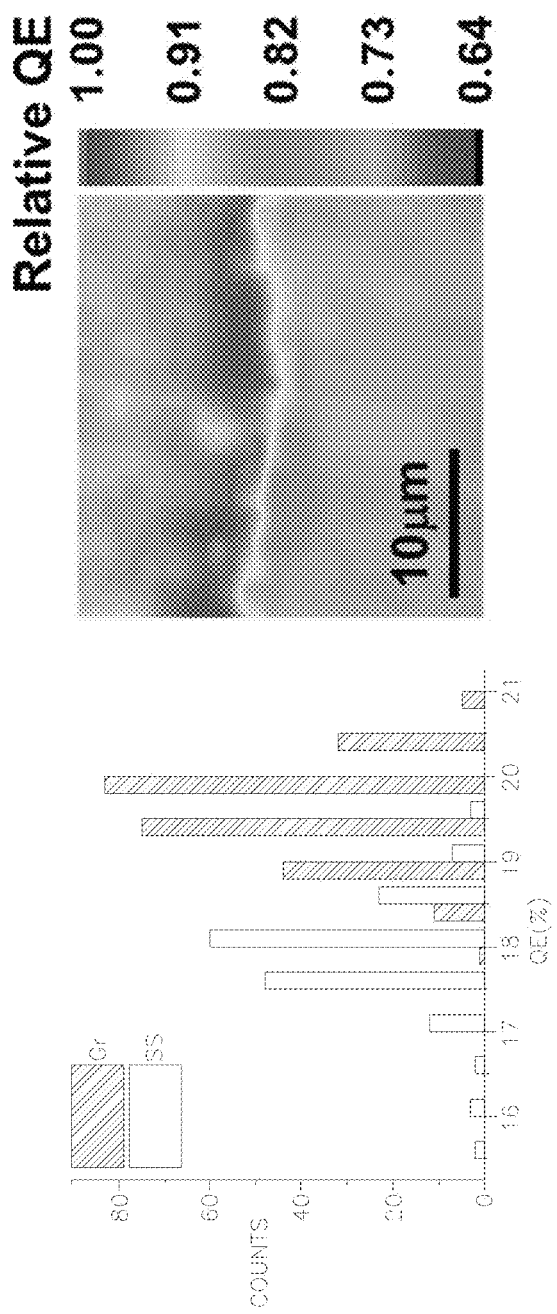

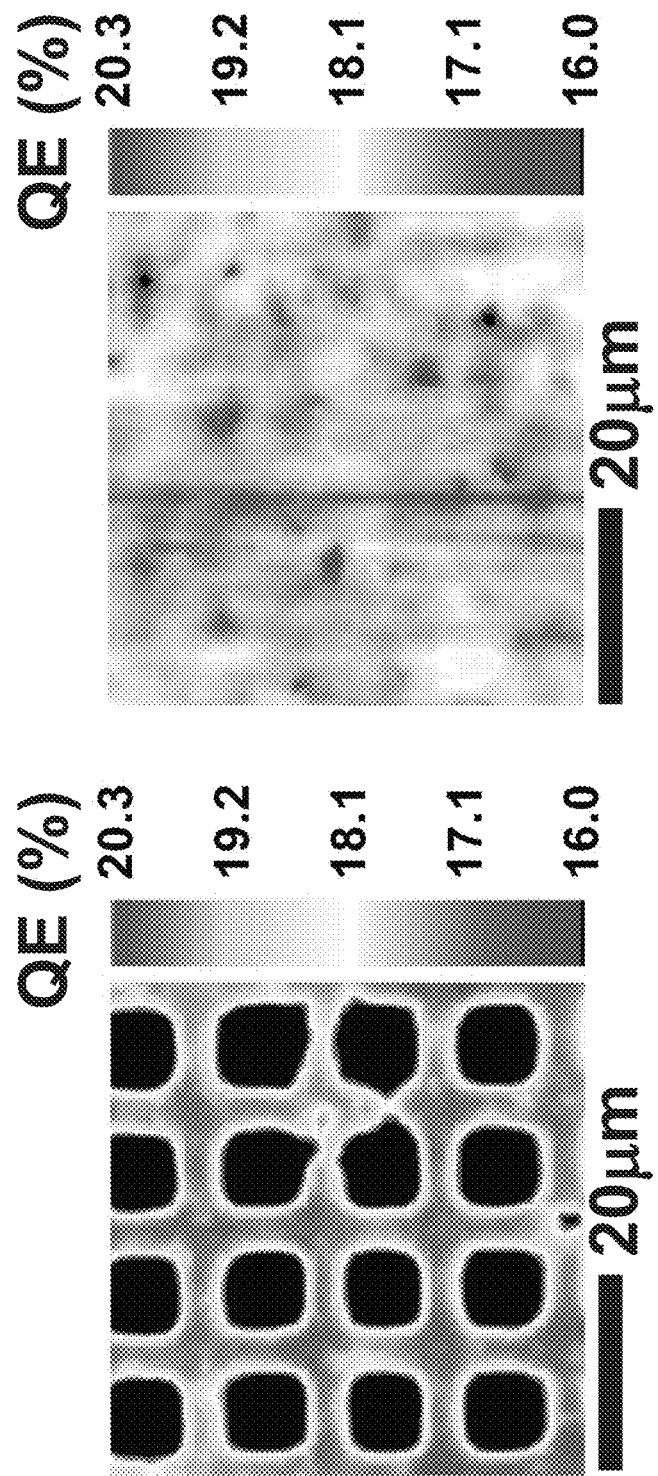

PHOTOCATHODES WITH AN ENHANCEMENT LAYER AND METHOD OF MAKING THE SAME

CROSS-REFERENCE TO RELATED APPLICATION

The present application claims priority to and the benefit of U.S. Provisional Application No. 62/830,221, entitled "PHOTOCATHODES WITH AN ENHANCEMENT LAYER AND METHOD OF MAKING THE SAME", filed on Apr. 5, 2019, the entire content of which is incorporated herein by reference.

STATEMENT REGARDING GOVERNMENT RIGHTS

The United States government has rights in this invention pursuant to Contract No. 89233218CNA000001 between the United States Department of Energy/National Nuclear Security Administration and Triad National Security, LLC for the operation of Los Alamos National Laboratory.

FIELD OF THE INVENTION

The present invention generally relates to photocathodes.

BACKGROUND

A photocathode is a cathode that emits electrons when exposed to radiant energy, especially light. Photocathodes include photosensitive films that, when struck by a quantum of light (photons), convert the absorbed energy to electron emission due to the photoelectric effect. Photocathodes may be characterized by the quantum efficiency (QE) (the ratio of the emitted electrons over the incident photons). U.S. Pat. No. 8,823,259 discloses other parameters typically utilized to characterize photocathodes, the disclosure of which is incorporated herein in its entirety by reference.

Photocathodes have been utilized in opto-electronic devices, such as TV camera tubes, image tubes, motion detectors and counters, etc., to provide electron sources.

Another example application of the photocathodes is to provide electron sources in x-ray devices. X-rays are commonly known for imaging human bodies (e.g., for broken bones). However, X-rays are also utilized extensively in new material development processes, including development of new medicines for curing cancers, high performance batteries for automobile industries, lightweight and high mechanical strength materials for space missions, etc. X-rays have wavelengths that match the size of atoms, which lead to the unique capability to gain structural information of materials at an atomistic precision. The instruments that can generate high brightness and coherent x-ray sources for atomic scale material investigations are only available at accelerator facilities currently. An emergent problem is that required performance to access, observe, and control matter on the frontier timescale of electronic motion and the spatial scale of atomic bonds dramatically outstrip the capabilities of present state-of-the-art electron sources and cathode technologies. To solve this problem, there is a need to improve the quantum efficiency of photocathodes.

SUMMARY

According to an embodiment of the present disclosure, a photocathode assembly may include: a reflective substrate; an enhancement layer on the reflective substrate; and a photosensitive film on the enhancement layer, wherein the enhancement layer has a thickness of about 10 nm or less and the reflective substrate has a reflectivity of 50% or greater.

The enhancement layer may include one or more atomic layers of graphene sheet, hexagonal boron nitride, transition metal dichalcogenides, transition metal carbides, transition metal nitrides, or transition metal carbonitrides. The transition metal carbides, transition metal nitrides, and transition metal carbonitrides are also referred to as MXenes.

The enhancement layer may include a single atomic layer of graphene sheet, a single atomic layer of hexagonal boron nitride, a monolayer of transition metal dichalcogenides, a monolayer of transition metal carbides, a monolayer of transition metal nitrides, or a monolayer of transition metal carbonitrides.

The reflective substrate may include a material selected from stainless steel, Au, Al, Ag, W, Mo, Ni, Pt, Pd, Cu, Si, $SiO_2$, GaAs, and $Si_3N_4$.

The photosensitive film may be selected from a metal; a bi-alkali compound; a multi-alkali compound; an alkali-semiconductor alloy; an alkali-halide; an alkali bi-metallic alloy; polycrystalline diamond; and combinations thereof.

The photosensitive film may be selected from Cu, Ni, Mg, Y, Sm, Ba, Nb, Ca, Au, Mg—Ba, a bi-alkali compound, a multi-alkali compound; $K_2CsSb$, $Cs_3Sb$, KCsSb mixed with CsBr, $K_3Sb$, $Na_2KSb$, $Li_2CsSb$, $Cs_2Te$, CsTe mixed with CsBr, CsKTe, $K_2Te$, $Rb_2Te$, RbCsTe; CsI; CsI—Ge; GaAs; InGaAs; CsAu, RbAu; polycrystalline diamond; and combinations thereof.

The photocathode assembly may further include a sealing layer on a side of the photosensitive film facing away from the enhancement layer.

The sealing layer may include a metal halide, SiOx, hexatricontane (HTC), and/or calcium stearate (CaSt).

According to an embodiment of the present disclosure, a method for manufacturing a photocathode assembly includes: depositing an enhancement layer on a reflective substrate to form an enhancement layer-reflective substrate laminate, the enhancement layer has a thickness of about 10 nm or less; and depositing a photosensitive film on the enhancement layer-reflective substrate laminate to form a photosensitive film-enhancement layer-reflective substrate laminate, wherein the reflective substrate has a reflectivity of 50% or greater.

The enhancement layer may include one or more atomic layers of graphene sheet, hexagonal boron nitride, transition metal dichalcogenides, transition metal carbides, transition metal nitrides, or transition metal carbonitrides.

The enhancement layer may include a single atomic layer of graphene sheet, a single atomic layer of hexagonal boron nitride, a monolayer of transition metal dichalcogenides, a monolayer of transition metal carbides, a monolayer of transition metal nitrides, or a monolayer of transition metal carbonitrides.

The reflective substrate may include a material selected from stainless steel, Au, Al, Ag, W, Mo, Ni, Pt, Pd, Cu, Si, $SiO_2$, and $Si_3N_4$.

The depositing of the enhancement layer may be through chemical vapor deposition.

The depositing of the enhancement layer may include: depositing the enhancement layer on a carrier substrate to form an enhancement layer-carrier laminate; applying a polymer film on the enhancement layer to form a polymer film-enhancement layer-carrier laminate; removing the carrier substrate from the polymer film-enhancement layer-carrier laminate to form a polymer film-enhancement layer laminate; attaching the reflective substrate to the polymer film-enhancement layer laminate to form a polymer film-enhancement layer-reflective substrate laminate; and removing the polymer film from the polymer film-enhancement layer-reflective substrate laminate to form an enhancement layer-reflective substrate laminate.

The method may further include depositing a sealing layer on the photosensitive film to form a sealing layer-photosensitive film-enhancement layer-reflective substrate laminate.

The depositing of the photosensitive film on the enhancement layer-reflective substrate laminate may include depositing the photosensitive film directly on the enhancement layer of the enhancement layer-reflective substrate laminate through chemical vapor deposition.

The photosensitive film may be selected from a metal; a bi-alkali compound; a multi-alkali compound; an alkali-semiconductor alloy; an alkali-halide; an alkali bi-metallic alloy; polycrystalline diamond; and combinations thereof.

According to an embodiment of the present disclosure, a method for improving quantum efficiency of bialkali photocathodes includes: depositing an enhancement layer on a reflective substrate to form an enhancement layer-reflective substrate laminate, the enhancement layer has a thickness of about 10 nm or less; and depositing a photosensitive film on the enhancement layer-reflective substrate laminate to form a photosensitive film-enhancement layer-reflective substrate laminate, wherein the reflective substrate has a reflectivity of 50% or greater.

The enhancement layer may include one or more atomic layers of graphene sheet, hexagonal boron nitride, transition metal dichalcogenides, transition metal carbides, transition metal nitrides, or transition metal carbonitrides.

An improvement in quantum efficiency may be from about 10% to about 80% greater than a quantum efficiency of a corresponding bialkali photocathode without the enhancement layer.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and other features and advantages of the present invention will be better understood by reference to the following detailed description when considered in conjunction with the accompanying drawings, in which:

FIG. 5C is statistics of QE in FIG. 5B by pixel counts.

FIG. 5D is an enlarged region of the black square in FIG. 5B with intensity normalized to the maximum value.

FIGS. 7A and 7B are each a 405 nm illuminated quantum efficiency (QE) map of $K_2CsSb$ photocathodes with (FIG. 7A) and without (FIG. 7B) hexagonal boron nitride coating on nickel substrates.

DETAILED DESCRIPTION

Figure 1:
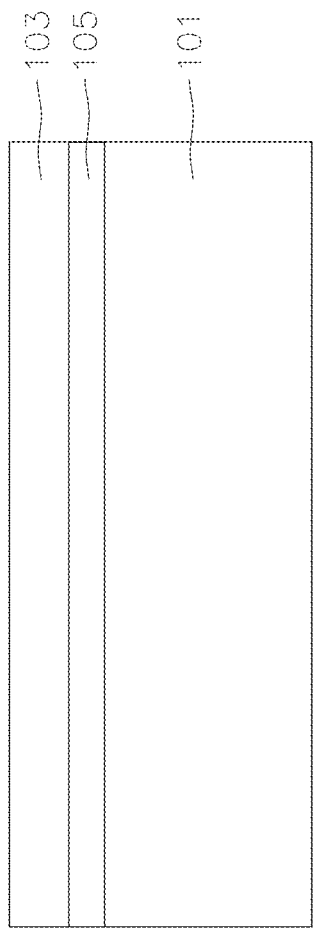
FIG. 1 is a schematic cross sectional view of a photocathode assembly according to an embodiment of the present disclosure.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments of the present disclosure are merely described below, by referring to the figures, to explain aspects of the present description.

As used herein, the term "and/or" includes any and all combinations of one or more of the associated listed items. Expressions such as "at least one of," when preceding a list of elements, modify the entire list of elements and do not modify the individual elements of the list.

As the inventive concept allows for various changes and numerous embodiments, particular embodiments will be illustrated in the drawings and described in more detail in the written description. Effects, features, and a method of achieving the inventive concept will be obvious by referring to exemplary embodiments of the inventive concept with reference to the accompanying drawings. The inventive concept may, however, be embodied in many different forms and should not be construed as being limited to the embodiments set forth herein.

In the embodiments described in the present specification, an expression utilized in the singular encompasses the expression of the plural, unless it has a clearly different meaning in the context. Also, it is to be understood that the terms such as "including," "having," and/or "comprising" are intended to indicate the presence of the stated features or components, and are not intended to preclude the presence or addition of one or more other features or components.

It will be understood that when a layer, region, or component is referred to as being "on" or "onto" another layer, region, or component, it may be directly or indirectly formed on the other layer, region, or component. That is, for example, intervening layer(s), region(s), or component(s) may be present.

Sizes of components in the drawings may be exaggerated for convenience of explanation. In other words, since sizes and thicknesses of components in the drawings are arbitrarily illustrated for convenience of explanation, the following embodiments of the present disclosure are not limited thereto.

FIG. 1 is a schematic cross sectional view of a photocathode assembly according to an embodiment of the present disclosure. Referring to FIG. 1, according to an embodiment of the present disclosure, a photocathode assembly 100 may include: a reflective substrate 101; an enhancement layer 105 on the reflective substrate 101; and a photosensitive film 103 on the enhancement layer 105. The enhancement layer 105 is an atomically thin layer. In one embodiment, the enhancement layer 105 has a thickness of about 10 nm or less. For example, the enhancement layer 105 may have a thickness of about 5 nm, 1 nm, 5 Å or 4 Å.

The reflective substrate 101 may be formed of a metallic, semiconductor or ceramic material. In one embodiment, the reflective substrate 101 is made of metal (e.g., gold (Au), aluminum (Al), silver (Ag), tungsten (W), molybdenum (Mo), nickel (Ni), platinum (Pt), palladium (Pd), or copper (Cu)), semiconductor (e.g., Si), or ceramic (e.g., $Si_3N_4$) materials. In one embodiment, the reflective substrate 101 may have a reflectivity of 50% or greater, or have a transmission of light of less than 50%.

The reflective substrate 101 may be in the form of a mesh, which is formed of a plurality of wires (also referred to as mesh grids). The plurality of wires forming the mesh may extend in two or more different directions crossing one another and form a plurality of openings surrounded by the wires. The wires of the mesh may be 0.1 microns to 100 microns in diameter (or width). For example, the wires may be 1 to 10 microns in diameter. The openings of the mesh may be 1 to 100 microns in diameter for circular shaped openings or 1 to 100 microns in length for, e.g., rectangular shaped openings. In one embodiment, the openings of the mesh may be 2 to 20 microns in diameter or in length.

The enhancement layer 105 may have a thickness of one to ten atoms. It may be in direct contact with the reflective substrate 101. The enhancement layer 105 may include a suitable material that can be deposited as atomically thin layers. The enhancement layer 105 may be selected from one or more atomic layers of graphene sheet(s), one or more atomic layer(s) of hexagonal boron nitride, one or more atomic layer(s) of transition metal dichalcogenides, one or more atomic layer(s) of transition metal carbides, one or more atomic layer(s) of transition metal nitrides, or one or more atomic layer(s) of transition metal carbonitrides.

Graphene is generally described as a one-atom-thick planar sheet of sp2-bonded carbon atoms that are densely packed in a honeycomb shaped crystal lattice. Graphene is the basic structural element of some carbon allotropes including graphite, carbon nanotubes and fullerenes. It should be understood that the terms "graphene," and "graphene sheet" as used herein refer only to a single atomic layer (i.e., a single sheet) of graphene, while the term "graphene layer" may refer to a single sheet (layer) of graphene or multiple graphene sheets (layers) stacked over one another.

In one embodiment, the enhancement layer 105 may include one or more layers of graphene sheets. For example, the enhancement layer 105 may include 1 to 10 layers, 2 to 8 layers, or 5 layers of graphene sheets. In one embodiment, the enhancement layer 105 may be a single layer (monolayer) of graphene sheet.

In one embodiment, the enhancement layer 105 may include one or more atomic layers of hexagonal boron nitride. The hexagonal boron nitride has a layered structure similar to graphite where within each layer, boron and nitride atoms are bound by strong covalent bonds whereas the layers are held together by weak van der Waals forces. In one embodiment, the enhancement layer 105 may be a single layer (monolayer) of hexagonal boron nitride.

In one embodiment, the enhancement layer 105 may include one or more atomic layers of transition metal dichalcogenides. The transition metal dichalcogenides may be represented by $MX_2$, where M is a transition metal atom (Mo, W, etc.) and X is a chalcogen atom (sulfur (S), selenium (Se), or tellurium (Te)). In one embodiment, the enhancement layer 105 may be a single atomic layer (monolayer) of transition metal dichalcogenides, which has the structure of one layer of M atoms being sandwiched between two layers of X atoms.

In one embodiment, the enhancement layer 105 may include one or more atomic layers (i.e., a monolayer or multiple atomic layers) of transition metal carbides, transition metal nitrides, or transition metal carbonitrides, together referred to as MMXenes. These compounds may be represented by a general formula $M_{n+1}AX_n$, where M is a transition metal atom, A is an element from group 13 or 14 of the periodic table, and X is C and/or N. A may not be present for some MXenes. Because the surfaces of MXenes can be terminated by functional groups, the naming convention $M_{n+1}X_nT_x$ may be utilized, where T is a functional group (e.g., O, F, OH, Cl). In addition, MXene carbides have been synthesized that are composed of two transition metals. MXenes in this new family have the general formulas $M'_2M''C_2$ or $M'_2M''_2C_3$, where M' and M" are different transition metals.

The photosensitive film 103 is on the enhancement layer 105. The photosensitive film 103 may be formed of any suitable photosensitive materials. For example, suitable photosensitive materials may include a metal, such as Cu, Ni, magnesium (Mg), yttrium (Y), samarium (Sm), barium (Ba), niobium (Nb), calcium (Ca), Au, or Mg—Ba; a bi-alkali compound, such as high-temperature bi-alkali compound or low noise bi-alkali compound; a multi-alkali compound; an alkali-semiconductor alloy, such as $K_2CsSb$, $Cs_3Sb$, KCsSb mixed with CsBr, $K_3Sb$, $Na_2KSb$, $Li_2CsSb$, $Cs_2Te$, CsTe mixed with CsBr, CsKTe, $K_2Te$, $Rb_2Te$, or RbCsTe; an alkali-halide, such as CsI; CsI—Ge; GaAs; InGaAs; an alkali bi-metallic alloy such as CsAu, RbAu; polycrystalline diamond; or combinations thereof.

The photosensitive film may have a thickness suitable for the application of the photosensitive device in which it is employed, for example, the photosensitive film may have a thickness of 10 nm to 1000 nm, for example, 100 nm to 500 nm.

The photocathode assembly may further include a barrier layer on the photosensitive film 103. That is, the photosensitive film 103 may be between the barrier layer and the enhancement film 105. The barrier layer may be a graphene layer, a graphene oxide layer, hexagonal boron nitride, transition metal dichalcogenides, transition metal carbides, transition metal nitrides, transition metal carbonitrides, and/ or a salt layer (such as a LiF layer). In one embodiment, the barrier layer is a graphene layer including one or more graphene sheets.

The photocathode assembly may further include a sealing layer on the photosensitive film 103. That is, the photosensitive film 103 may be between the sealing layer and the enhancement film 105. The sealing layer may include a material selected from a metal halide (such as NaI, CsBr, CsI, $MgF_2$, NaF, LiF, and CsF), SiOx, hexatricontane (HTC), and calcium stearate (CaSt).

The photosensitive film 103 is in direct contact with the enhancement layer 105, and the enhancement layer 105 is between the photosensitive film and the reflective substrate 101.

Figure 2:
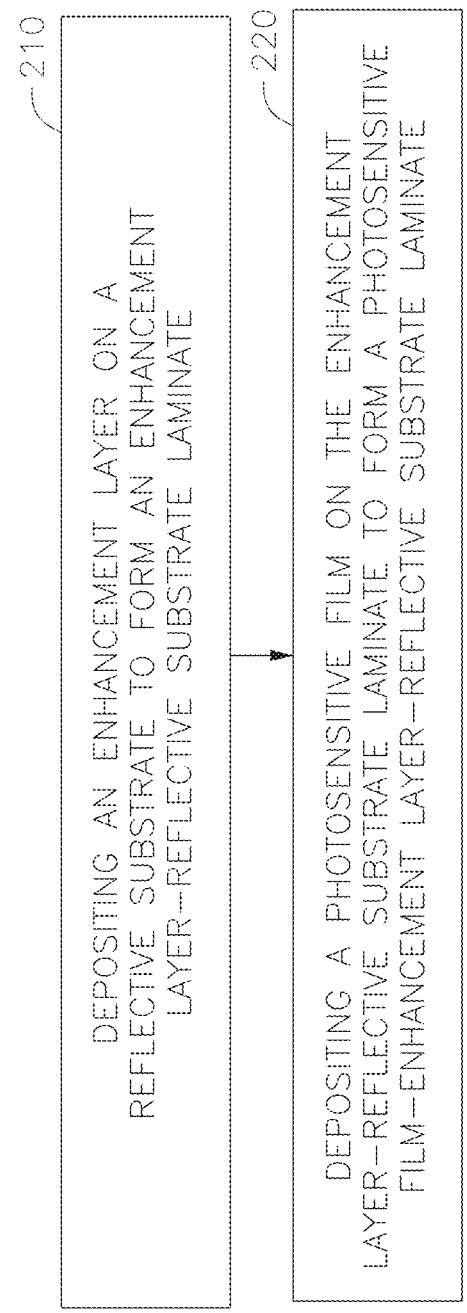
FIG. 2 is a flowchart illustrating a process of making a photocathode assembly according to an embodiment of the present disclosure.

FIG. 2 is a flowchart illustrating a process of manufacturing a photocathode assembly according to an embodiment of the present disclosure.

Referring to FIG. 2, a method for manufacturing a photocathode assembly includes depositing an enhancement layer on a reflective substrate to form an enhancement layer-reflective substrate laminate (act 210), the enhancement layer has a thickness of about 10 nm or less; and depositing a photosensitive film on the enhancement layer-reflective substrate laminate to form a photosensitive film-enhancement layer-reflective substrate laminate (act 220).

The enhancement layer is an atomically thin layer. The enhancement layer may have a thickness of one to ten atoms. The enhancement layer may be selected from one or more atomic layers of graphene sheet(s), one or more atomic layer(s) of hexagonal boron nitride, one or more atomic layer(s) of transition metal dichalcogenides, one or more atomic layer(s) of transition metal carbides, one or more atomic layer(s) of transition metal nitrides, or one or more atomic layer(s) of transition metal carbonitrides.

In one embodiment, the enhancement layer may include one or more layers of graphene sheets. The enhancement layer may include 1 to 10 layers of graphene sheets. In one embodiment, the enhancement layer may be a single layer of graphene sheet.

In one embodiment, the enhancement layer may include one or more atomic layers of hexagonal boron nitride. In one embodiment, the enhancement layer may be a single layer of hexagonal boron nitride. In one embodiment, the enhancement layer may include one or more layers of transition metal dichalcogenides sheets. In one embodiment, the enhancement layer may include one or more layers of transition metal carbides sheets. In one embodiment, the enhancement layer may include one or more layers of transition metal nitrides sheets. In one embodiment, the enhancement layer may include one or more layers of transition metal carbonitrides sheets.

Figure 3:
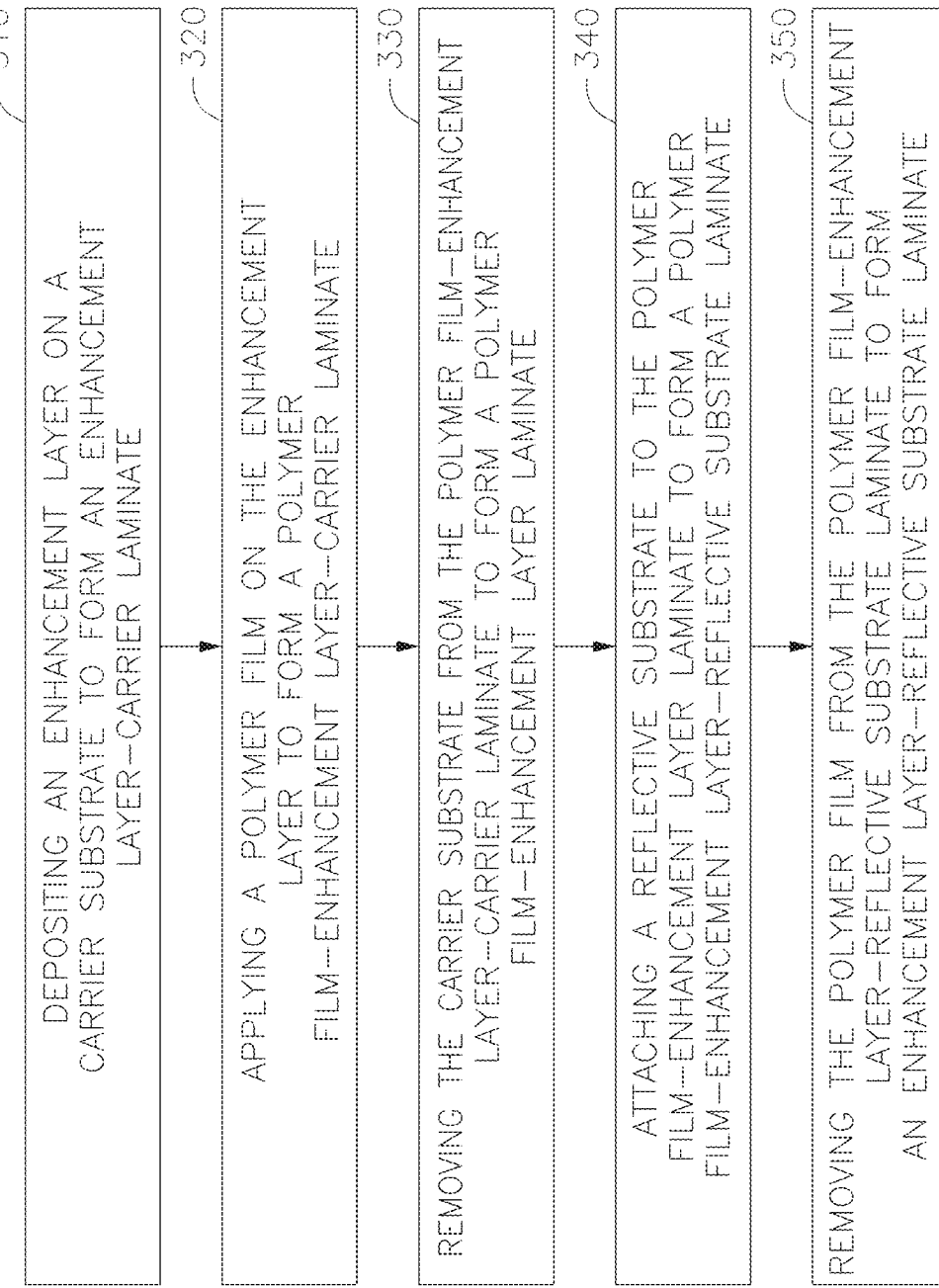
FIG. 3 is a flowchart illustrating a process of depositing the enhancement layer according to an embodiment of the present disclosure.

FIG. 3 is a flowchart illustrating a process of depositing the enhancement layer according to an embodiment of the present disclosure.

Referring to FIG. 3, a method for depositing the enhancement layer includes depositing an enhancement layer on a carrier substrate to form an enhancement layer-carrier laminate (act 310); applying a polymer film on the enhancement layer to form a polymer film-enhancement layer-carrier laminate (act 320); removing the carrier substrate from the polymer film-enhancement layer-carrier laminate to form a polymer film-enhancement layer laminate (act 330); attaching a reflective substrate to the polymer film-enhancement layer laminate to form a polymer film-enhancement layer-reflective substrate laminate (act 340); and removing the polymer film from the polymer film-enhancement layer-reflective substrate laminate to form an enhancement layer-reflective substrate laminate (act 350).

The carrier substrate may be any suitable material that can stand the enhancement layer deposition process and not chemically interfering with the enhancement layer. For example, the carrier substrate may be Cu foil or Ni foil. The carrier substrate may be pre-treated by an annealing process prior to the deposition of the enhancement layer. For example, the carrier substrate may be heated at 400° C. for at least two hours in at least 1E-8 torr vacuum.

The depositing of the enhancement layer may be through chemical vapor deposition (CVD). For example, when graphene sheets are utilized for the enhancement layer, a high temperature is required for graphene growth and the temperature is typically 900° C. or higher. In one embodiment, the graphene layer may be formed in a CVD process conducted at 1000° C. utilizing $CH_4/H_2$. However, embodiments of the present disclosure are not limited thereto. In one embodiment, the deposition of the enhancement layer may be through liquid-phase-exfoliation.

The polymer film may be applied on the enhancement layer-carrier laminate through any suitable method, such as spin coating. The polymer film may be made of a suitable material, such as PMMA.

The removing of the carrier substrate from the polymer film-enhancement layer-carrier laminate may include: etching away the carrier substrate, or peeling the carrier substrate away utilizing a mechanical force. The etching may be conducted utilizing a suitable etchant, for example, an acid including a blend of $HNO_3$, $H_3PO_4$ and $H_2O$, and the etching may be conducted for a suitable duration, e.g., about 2 to 6 hours.

In one embodiment, the polymer film-enhancement layer laminate may be transferred to the target substrate (e.g., the reflective substrate), or an intermediate substrate, such as a $Si/SiO_2$ substrate, to be followed by drying of the polymer film-enhancement layer laminate.

In another embodiment, the carrier substrate may be removed through a mechanical force. For example, the carrier substrate may be peeled off from the polymer film-enhancement layer-carrier laminate by a mechanical force.

The attaching of the reflective substrate to the polymer film-enhancement layer laminate to form a polymer film-enhancement layer-reflective substrate laminate may be simply realized by bringing the free surface of the enhancement layer (i.e., the side opposite to the one in contact with the polymer film) to be in contact with a surface of the reflective substrate. Without being bound by any particular theory, it is believed that the van der Waals force forms a strong bond between the enhancement layer and the reflective substrate. When a plurality of graphene sheets are individually formed and stacked together in forming the enhancement layer, it is believed that the van der Waals force forms a strong bond between adjacent graphene sheets. However, embodiments of the present disclosure are not limited thereto.

The removing of the polymer film from the polymer film-enhancement layer-reflective substrate laminate may include etching the polymer film utilizing a suitable solvent, such as acetone. The surface of the enhancement layer from which the polymer layer is removed may be treated utilizing a thermal cleaning procedure including, e.g., heating at 400° C. for at least two hours in at least 1E-8 torr vacuum.

The depositing of the photosensitive film on the enhancement layer may be conducted utilizing any suitable method, for example, by chemical vapor deposition. The photosensitive material is deposited to be in contact with the free surface of the enhancement layer (i.e., the surface opposite to the one in contact with the reflective substrate). A photosensitive film-enhancement layer-reflective substrate laminate is thereby manufactured. That is, a photocathode assembly with an enhancement layer is thereby manufactured.

To have an enhancement layer with multiple layers of graphene sheets, the multiple graphene sheets may be deposited on the carrier substrate first, and then laminated with the reflective substrate prior to the deposition of the photosensitive film.

The sealing layer may be deposited utilizing a suitable method, such as chemical vapor deposition.

U.S. patent application Ser. No. 15/644,711 discloses suitable methods utilized to deposit graphene sheets, the disclosure of which is incorporated herein in its entirety by reference.

According to an embodiment of the present disclosure, a method for improving quantum efficiency of bialkali photocathodes includes depositing an enhancement layer between a reflective substrate and a photosensitive film. For example, the method may include depositing an enhancement layer on a reflective substrate to form an enhancement layer-reflective substrate laminate, the enhancement layer has a thickness of about 10 nm or less; and depositing a photosensitive film on the enhancement layer-reflective substrate laminate to form a photosensitive film-enhancement layer-reflective substrate laminate, wherein the reflective substrate has a reflectivity of 50% or greater.

Embodiments of the present disclosure will be further illustrated through the following examples. However, the present disclosure is not limited by these examples.

Synthesis and Transfer of Monolayer:

Graphene monolayer was synthesized via chemical vapor deposition (CVD) utilizing methane gas as the carbon source and copper (Cu) foil as the substrate. Hexagonal boron nitride (hBN) monolayer grown by CVD on copper foil was purchased from Graphene Supermarket.

For wet-transfer of CVD graphene and hexagonal boron nitride onto various substrates, poly(methyl methacrylate) (PMMA) was utilized as a mechanical support (i.e., as the polymer film) and removed by acetone rinsing afterwards.

Deposition of Bialkali Antimonide Photocathodes for Vacuum Tube:

Graphene films on stainless steel (SS) foil frame (SS304), graphene films on sapphire substrate, and hexagonal boron nitride films on nickel (Ni) transmission electron microscope (TEM) mesh grid were installed for bialkali antimonide photocathode deposition at Photonis Scientific Inc. All vacuum envelope components were pre-cleaned at 350° C. in ultra-high vacuum (UHV) prior to in-situ photocathode deposition. While monitoring the sensitivity of the photocathode films, the components K, Cs, and Sb were deposited on each of the substrates via thermal evaporation to achieve a target (e.g., typical) stoichiometry of $K_2CsSb$ with a thickness of about 25-30 nm. The vacuum-sealed package includes (e.g., consisted of) sapphire windows on both sides (e.g., the photosensitive film side and the substrate side) of the photocathode assembly, and has metal traces patterned on the windows to establish an extracting electric field. That is, the vacuum-sealed package (the photocathode assembly) includes the structure of sapphire window (with metal traces)/substrate/graphene or hexagonal boron nitride film/$K_2CsSb$/sapphire window (with metal traces) stacked over one another in the stated order.

Photoemission Measurement of Bialkali Antimonide Photocathodes in Vacuum Tube:

A 405 nm light emitting diode (LED) (for large area QE maps) and diode laser (for high spatial resolution QE maps) were respectively utilized as light sources for photoemission measurements. The focused spot size was less than 350 nm for the 405 nm LED and about 0.20 mm for the diode laser, respectively. Anode traces on the sapphire windows were sufficiently biased with respect to the photocathode assembly to overcome space-charge effects and collect photoelectrons in all cases. The quantum efficiency was calculated utilizing the known power of incident light at 405 nm, as obtained from a calibrated reference diode. A home-built confocal microscopy system with a scanning mirror that allows for precise location of the focal point onto the sample surface was utilized for high spatial resolution QE maps.

Material Characterization of Bialkali Antimonide Photocathodes:

In-situ X-ray diffraction (XRD) growth studies on $K_2CsSb$ were performed at the Brookhaven National Laboratory National Synchrotron Light Source II (NSLS-II) beam line ID-4 (ISR) utilizing photon energy of 11.47 KeV ($\lambda=1.0809$ Å). The thin film growth was performed in a custom-built ultra-high vacuum chamber with a low base pressure of $10^{-10}$ torr. Hexagonal boron nitride grown by CVD was transferred onto Si substrates. The reference Si substrates (i.e., without the enhancement film) and coated substrates (i.e., coated with hexagonal boron nitride) were loaded into the growth chamber and annealed at 550° C. for 1 hour. Co-evaporation of K, Cs and Sb utilizing pure metallic sources was utilized to fabricate $K_2CsSb$ photocathodes. The evaporation rate was controlled by adjusting the current of the fusion cells and was measured with a quartz crystal microbalance (QCM) placed alongside the sample. Alkali and antimony sources were turned on simultaneously, and the rates of the three elements were set to match the stoichiometry of $K_2CsSb$ based on real-time X-ray fluorescence (XRF) analysis. During deposition, the substrate temperature was set to about 90° C. The XRD data were measured utilizing a 4 axis diffractometer with a Pilatus 100 K X-ray camera mounted 100 cm downstream from the substrate. XRD was measured with a 2θ range from 2° to 5°. The XRF spectra were measured by a vortex multi-cathode X-ray detector mounted at 45° with respect to the sample surface normal and approximately 25 cm away from the sample.

Figure 4A:
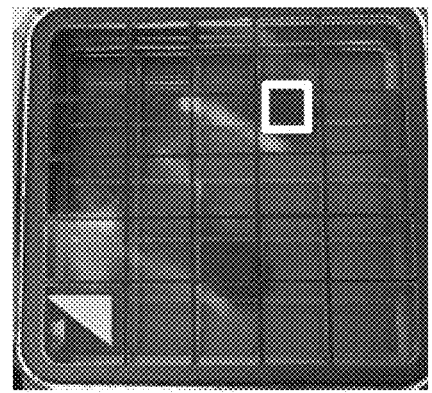
FIG. 4A is a photograph of a graphene film on a $SiO_2$/Si substrate. The black arrow indicates an edge of the graphene film.
Figure 4B:
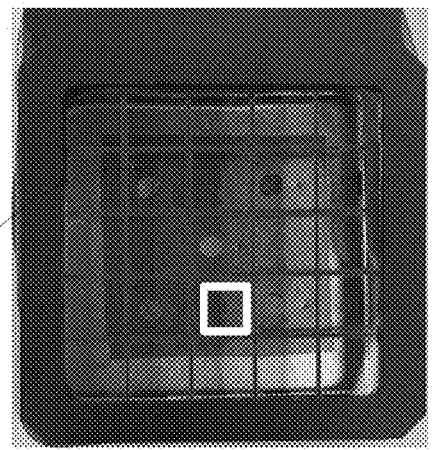
FIG. 4B is a photograph of $K_2CsSb$ photocathode deposited on a graphene film coated stainless steel substrate. The white square indicates a region of the graphene coating.
Figure 4C:
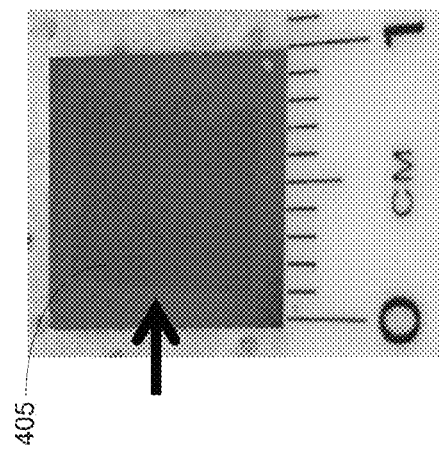
FIG. 4C is a photograph of $K_2CsSb$ photocathode deposited on a graphene film coated and annealed sapphire substrate. The white square indicates a region of the graphene coating.
Figure 4D:
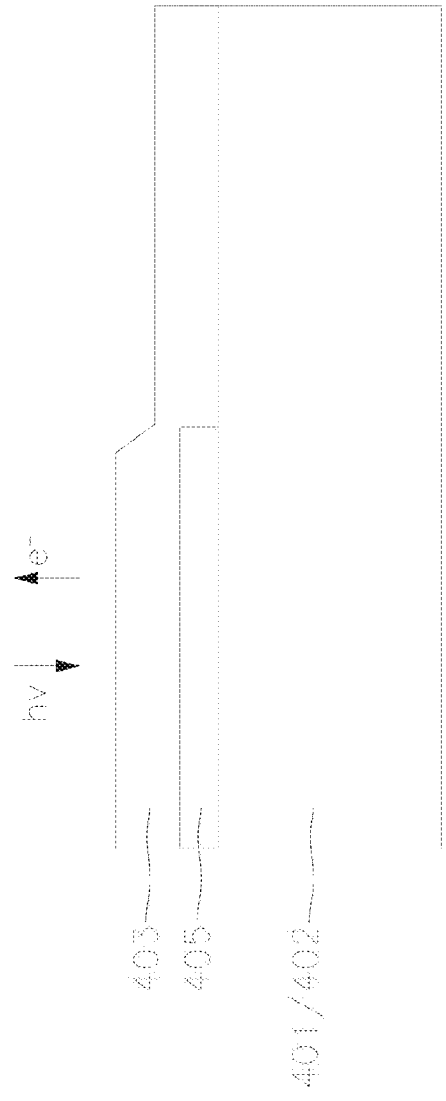
FIG. 4D is a schematic illustration of the side view of the photocathode structure and how photoemission measurements were performed.

Example 1—Bialkali Antimonide Photocathodes on Atomically Thin Layer Coated Substrates in a Sealed Vacuum Tube 1. Graphene Synthesis and Photocathode Deposition FIG. 4A is a photograph of a graphene layer on a $SiO_2$/Si substrate. The black arrow indicates an edge of the graphene layer. FIG. 4B is a photograph of $K_2CsSb$ photocathode deposited on the graphene coated stainless steel substrate. The white square indicates a region of graphene coating. FIG. 4C is a photograph of $K_2CsSb$ photocathode deposited on graphene coated and annealed sapphire substrate. The white square indicates a region of the graphene coating. FIG. 4D is a schematic illustration of the side view of the photocathode structure and how photoemission measurements were performed.

The graphene layer 405 utilized in this example was grown by chemical vapor deposition (CVD), which was confirmed to be a monolayer with minimal structural defects (FIG. 4A). Specifically, Raman spectroscopy showed a 2D/G peak ratio of about 3, where a 2D/G value of higher than about 2 is accepted as an indication of a monolayer.

There was no observable D peak at about 1350 cm$^{-1}$ that indicates the structural defect induced vibration mode in graphitic materials. The graphene layer was further characterized by atomic force microscopy (AFM), which showed a continuous film with a monolayer thickness of about 0.5 nm. These CVD graphene films were transferred onto stainless steel 401 or sapphire 402 substrates respectively utilizing an established polymer-supported wet-based method. After the removal of the polymer-support in an acetone bath and drying, the graphene-coated substrates were installed into vacuum tube assemblies.

Potassium cesium antimonide ($K_2CsSb$) photocathodes 403 were then deposited on the films and permanently sealed (FIG. 4B, 4C). Annealed sapphire with embedded metal grids 409 was utilized as windows to collect photoelectrons from the photocathodes. Quantum efficiency (QE) of photocathodes was measured in a reflection mode; illuminating from the photocathode side and collecting emitted electrons from the same side (FIG. 4D). The vacuum phototube setting allows a unique opportunity for long-term stability that can be inaccessible in dynamic pumping environments. The design utilized here also allows for routine and repeatable QE measurements of photocathodes of interest.

Figure 5B:
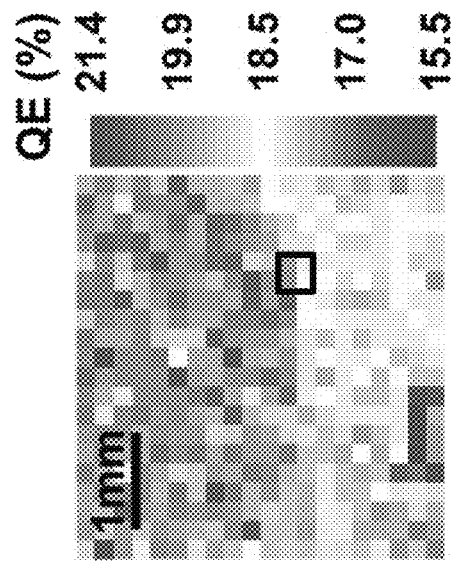
FIG. 5B is a 405 nm illuminated quantum efficiency (QE) map of $K_2CsSb$ photocathodes with 0.2 mm spatial resolution.
Figure 5A:
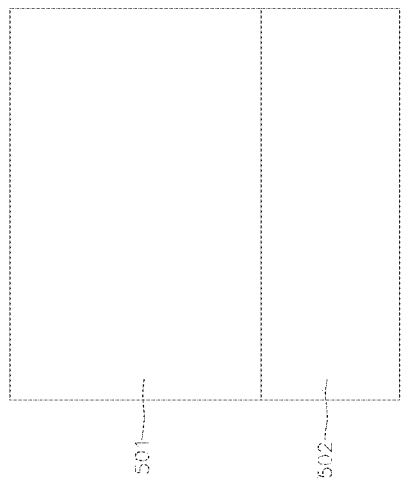
FIG. 5A is a schematic illustration of the top view of a $K_2CsSb$ photocathode structure.

Example 2—Quantum Efficiency Maps of Photocathodes on Graphene Coated Reflective Substrates FIG. 5A is a top view schematic of a photocathode structure. FIG. 5B is a 405 nm illuminated quantum efficiency (QE) map of $K_2CsSb$ photocathodes with 0.2 mm spatial resolution. FIG. 5C is statistics of QE in FIG. 5B by pixel counts. Gr and SS labels represent pixels in regions with and without the graphene coating in FIG. 5B, respectively. FIG. 5D is an enlarged region of the black square in FIG. 5B with intensity normalized to the maximum value. The scale bars are 1 mm and 10 μm for FIGS. 5B and 5D, respectively.

FIG. 5A is a top view schematic of a photocathode utilized in this study. Specifically, a chemically passivated stainless steel substrate with half-coated graphene was prepared and $K_2CsSb$ photocathode was deposited on it. In this example, half of the surface of the stainless steel substrate (501) is covered by the graphene layer (with the structure of stainless steel substrate/graphene layer/photocathode), and the other half (503) is in direct contact with the $K_2CsSb$ photocathode (with the structure of stainless steel substrate/photocathode). FIG. 5B is a QE map obtained by rastering a 405 nm (about 3.1 eV) light emitting diode (LED) with a spot size of about 0.2 mm. An overall QE of greater than 10% was achieved over the 4 mm×4 mm sample area, which indicates that the $K_2CsSb$ photocathodes are of high quality. What is immediately evident is an enhanced QE at the region of graphene coating. This region has a mean QE of 19.9% (maximum 21.4%, minimum 18.4%) in contrast to 18.1% (maximum 19.7%, minimum 15.5%) at the region without the graphene coating (FIG. 5C). The QE improvement due to the graphene coating (the enhancement layer) is 10% based on the QE of the region without the graphene coating. Here, the relative QE increase or decrease (also referred to as the "relative change" throughout the current specification) is calculated as the difference in QE between the two regions divided by the QE of the region without the graphene coating.

To resolve detailed features at the interface between regions with and without the graphene coating, high spatial resolution QE mapping utilizing a focused laser of 350 nm spot size was conducted. The photon energy was the same as that of LED (405 nm). Fine features at the interface that resemble optical microscopy images of graphene coating were observed (FIG. 5D). This further supports that graphene coatings are responsible for the QE enhancement. The average QE difference (relative change) between regions with and without graphene coating was consistent with FIG. 5B, which is relative 10%.

Figure 6B:
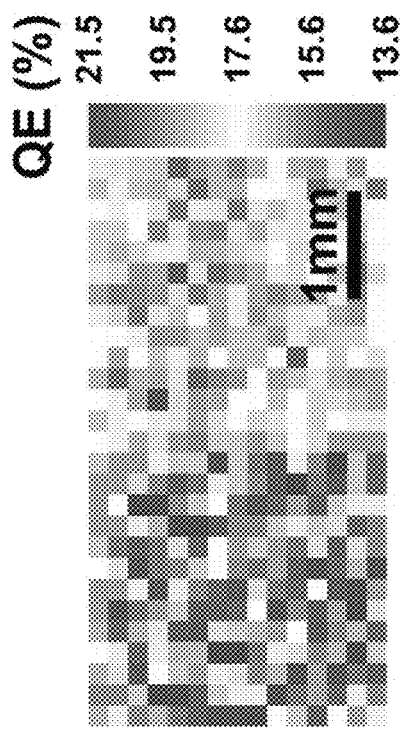
FIG. 6B is a corresponding QE map taken by 405 nm illumination with 0.2 mm spatial resolution.
Figure 6A:
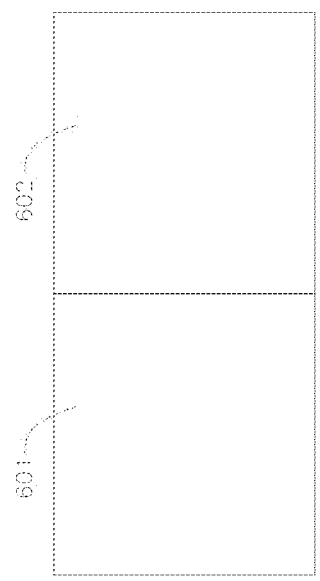
FIG. 6A is a schematic illustration of the top view of a photocathode structure.
Figure 6C:
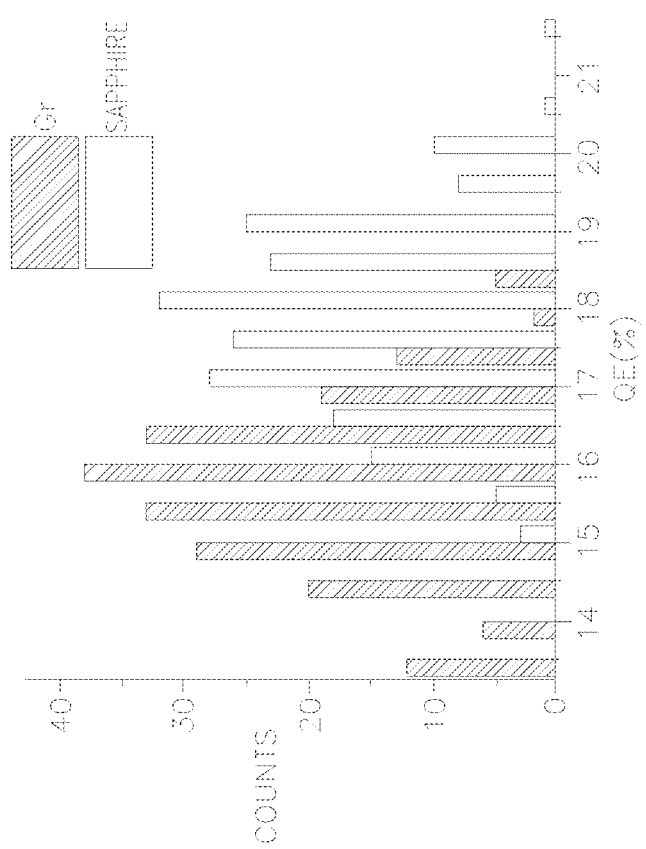
FIG. 6C is statistics of QE in FIG. 6B by pixel counts.

Comparative Example 1—Quantum Efficiency Maps of Photocathodes on Graphene Coated Transparent Substrates FIG. 6A is a schematic illustration of the top view of a photocathode structure. FIG. 6B is a corresponding QE map taken by 405 nm illumination with 0.2 mm spatial resolution. The scale bar is 1 mm. FIG. 6C is statistics of QE in FIG. 6B by pixel counts. Gr and Sapphire labels represent pixels in regions with and without graphene coating in FIG. 6B, respectively.

A role of substrate reflectivity in the observed QE enhancement can be studied by making a comparison on optically transparent substrates. To do so, a separate phototube with annealed sapphire substrate was prepared. The sapphire substrates had an optical transparency of 88% throughout the wavelength range of interest. FIG. 6A is a schematic illustration of the top view of the photocathode structure, which shows the graphene half-coating, i.e., half of the sapphire substrate 601 is coated with graphene (with the structure of sapphire substrate/graphene layer/photosensitive film) and the other half 602 is in direct contact with the photosensitive film (with the structure of sapphire substrate/photosensitive film). The QE map was obtained by the same configuration for metal (e.g., stainless steel) substrate case described above, which is to raster a 405 nm light emitting diode with spot size of about 0.2 mm over the 4 mm×4 mm sample area (FIG. 5B).

An overall QE of greater than 10% was achieved similar to the metal substrate case, indicating that the $K_2CsSb$ photocathodes are of high quality. In sharp contrast to the metal substrate case, however, the opposite effect of coating on the QE was observed. QE decreased for the region with graphene coating when a substrate is optically transparent. The decrease (i.e., the relative change) was 12.5% with a mean QE of 16.0% (maximum 18.8%, minimum 13.6%) and 18.0% (maximum 21.5%, minimum 15.2%) for regions with and without the coating, respectively (FIG. 6C). The result strongly suggests that the origin of enhanced QE is due to optical interactions between the atomically thin coating, the reflective substrate, and $K_2CsSb$ photocathodes. If the QE enhancement was due to other factors such as improvement of $K_2CsSb$ photocathodes crystal quality, then QE enhancement by the coating should occur regardless of the substrates being reflective or optically transparent.

Example 3—Quantum Efficiency Maps of Photocathodes on Hexagonal Boron Nitride Coated Reflective Substrates CVD hexagonal boron nitride (hBN), which was synthesized in similar conditions as that of graphene, was obtained. Specifically, hexagonal boron nitride was transferred onto nickel mesh grid, then K2CsSb photocathode was deposited on it, and finally sealed in a vacuum phototube. FIG. 7A is the high spatial resolution QE map taken utilizing focused laser with wavelength of 405 nm and spatial resolution of 350 nm. The orange/yellow region was focused on because the black square regions correspond to opening areas of the mesh grids. In comparison, FIG. 7B is the reference QE map without hexagonal boron nitride coating. A mean QE of 19.5% was achieved for photocathode with hexagonal boron nitride coating whereas it was 17.5% for the bare metal substrate (i.e., without the coating) counterpart. This leads to QE enhancement of relative 10% by the hexagonal boron nitride coating. The results demonstrate that the QE enhancement can be achieved by atomically thin coatings, including those formed of materials other than graphene.

The results suggest a possibility for generalized photocathode structure for enhancing QE. A scientific indication of these results is that there could be a novel optical interaction mechanism to enhance QE of semiconductor photocathodes utilizing atomically thin layer coatings. This could open up a new pathway in ongoing approach of engineering reflectivity of metal substrates to enhance the QE of deposited semiconductor photocathodes. A technological indication is that atomically thin layer coating may be a better alternative to time-consuming optimization of substrates pre-treatments. These results demonstrate that simply by coating atomically thin layers on reflective substrates, $K_2CsSb$ photocathodes, for example, QE that is higher than those on electrochemically polished and chemically passivated metal substrates can be achieved.

Example 4—Material Characterization of Photocathodes Deposited on Atomically Thin Layer Coated Substrates It has been demonstrated that $K_2CsSb$ photocathodes on graphene coated substrates exhibit X-ray diffraction (XRD) and X-ray fluorescence (XRF) spectra that are consistent with those deposited on reference bare silicon substrates. In particular, Yamaguchi et al (Advanced Materials Interfaces 5 (13), 1800249 (2018), which is incorporated herein as reference in its entirety) demonstrated utilizing X-ray diffraction (XRD) and X-ray fluorescence (XRF) that the crystal orientation, quality and elemental stoichiometry are identical for photocathodes deposited on substrates with and without atomically thin layer coatings. These results indicate that both the crystal quality and elemental stoichiometry of $K_2CsSb$ photocathodes do not change significantly due to graphene coating. The results provide a pathway toward simple method to enhance the QE of semiconductor photocathodes by capturing more of the incident light.

Figure 8B:
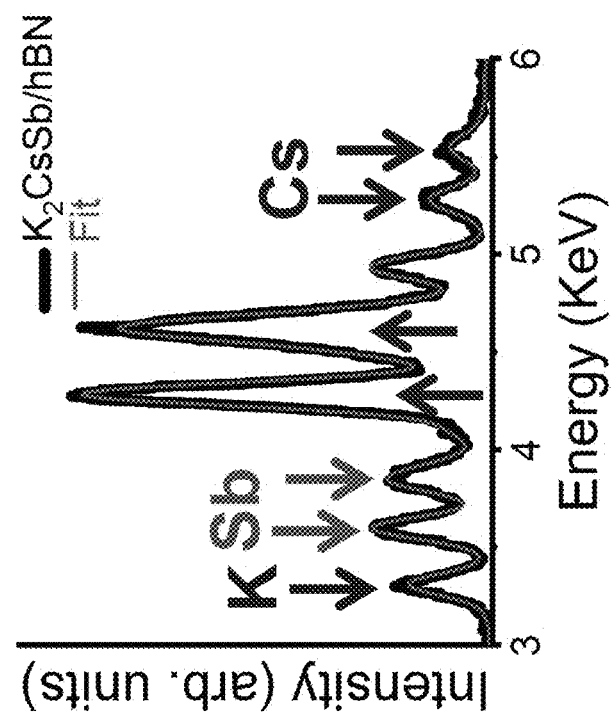
FIG. 8B is an X-ray fluorescence (XRF) spectrum of hexagonal boron nitride coated substrate (black). Black, green, and blue arrows indicate the peak positions of potassium (K), antinomy (Sb), and cesium (Cs), respectively. The red line is the fitted spectrum utilized for quantitative analysis.
Figure 8A:
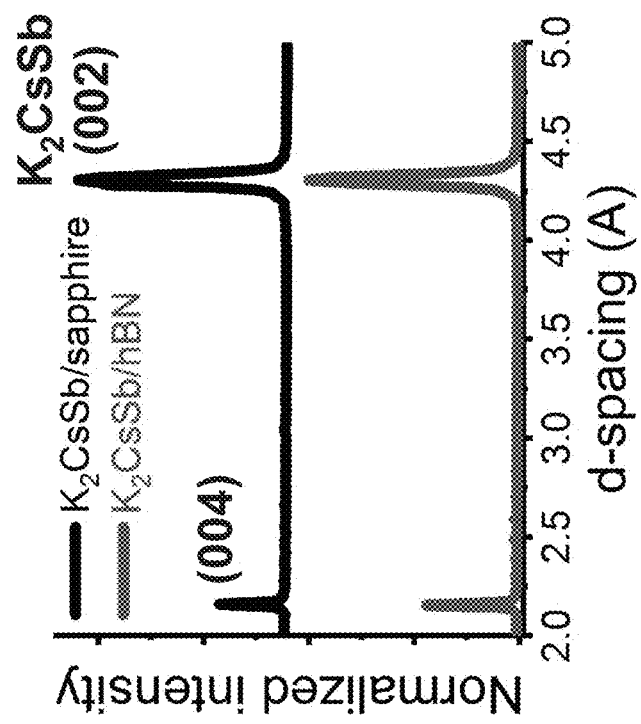
FIG. 8A is an X-ray diffraction (XRD) spectra of $K_2CsSb$ photocathodes deposited on sapphire (top) and hexagonal boron nitride coated substrates (bottom) at the National Synchrotron Light Source II of Brookhaven National Laboratory. The intensity is normalized to the $K_2CsSb$ (002).

Here, similar study on hexagonal boron nitride was performed. At National Synchrotron Light Source II (NSLS-II) of Brookhaven National Laboratory (BNL), $K_2CsSb$ photocathodes was deposited on hexagonal boron nitride coated substrates and monitored for XRD and XRF in-situ. The results are shown in FIGS. 8A and 8B. FIG. 8A is an XRD spectra of $K_2CsSb$ photocathodes deposited with (red) and without (black) hexagonal boron nitride coating on sapphire substrates. Peak positions and full width at half maximum (FWHM) are summarized in Table 1. Peak positions and FWHM were identical to each other with a good match of d-spacing between the theoretical values. Specifically, d-spacing were 3.40 and 2.15 Å, FWHMs were 0.03 and 0.01 Å for (002) and (004) crystal orientations, respectively. These results demonstrate that the crystal quality of $K_2CsSb$ photocathodes does not change due to the hexagonal boron nitrite coating. The elemental stoichiometry does not deviate either.

FIG. 8B is an XRF spectrum of $K_2CsSb$ photocathodes deposited with the hexagonal boron nitride coating. It showed the presence of potassium (K), antinomy (Sb), and cesium (Cs) as expected, where the unlabeled peak near 4.9 KeV corresponds to titanium (Ti) from the sample mount. Spectrum analysis revealed stoichiometry of $K_{2.37}Cs_{1.05}Sb$ and $K_{1.02}Cs_{1.08}Sb$ for with and without the coating, respectively. The stoichiometry for coated photocathode was very close to ideal values of $K_2CsSb$. Potassium deficiency for photocathode without the coating might be due to slightly off-centered substrate position during the deposition. Based on material characterization of photocathodes, the general trend is that atomically thin coating does not alter their crystal quality and elemental stoichiometry.

TABLE 1

List of d-spacing for observed peaks in comparison to the theoretical values (Theory) of $K_2CsSb$. Corresponding crystal facet orientations (HKL) and peak widths (full-width at half-maximum (FWHM)) (Width) are also shown.

|  | d-spacing (Å) | Width (Å) | (HKL) | Theory (Å) |
|---|---|---|---|---|
| Cathode/sapphire | 4.30 | 0.037 | (002) | 4.31 |
|  | 2.159 | 0.01 | (004) | 2.155 |
| Cathode/hBN | 4.305 | 0.033 | (002) | 4.31 |
|  | 2.155 | 0.01 | (004) | 2.155 |

According to embodiments of the present disclosure, the quantum efficiency (QE) of photocathodes can be enhanced and improved utilizing the atomically thin enhancement layer. For example, the quantum efficiency of potassium cesium antimonide photocathodes (for accelerator technology) can be improved by interfacing them with atomically thin layers. The enhancement occurs in a reflection mode, when atomically thin layer(s) (the enhancement film) is placed in-between the photocathode (also referred to as the photosensitive film, used interchangeably throughout this specification) and the metal substrate. That is, improvement in quantum efficiency of potassium cesium antimonide photocathodes can be achieved by having the enhancement film between the photosensitive film and the reflective substrate. For example, QE increases by an average of 10% at about 3.1 eV and at 405 nm, 18.2% at 532 nm and 36.3% at 633 nm with possible maximum value in a localized spot of as high as 80% at 633 nm when photocathodes are deposited on graphene coated stainless steel substrates. The percentage of QE increasement is calculated by dividing the difference in QE (QE of a photocathode with the enhancement film subtracted by QE of a substantially the same photocathode but without the enhancement film) by the QE of the photocathode without the enhancement film. There is a similar effect for hexagonal boron nitride monolayer coated nickel substrates. The enhancement does not occur when optically transparent sapphire substrate is utilized. Without being bound by any particular theory, these results suggest optical interactions of atomically thin layer with reflected light from the substrates as the origin of the enhancement.

According to embodiments of the present disclosure, atomically thin layers such as graphene, hexagonal boron nitride, transition metal dichalcogenides, transition metal carbides, transition metal nitrides, or transition metal carbonitrides can play both roles of surface passivation and engineering of the metal substrates. Without being bound by any particular theory, it is believed that the atomic thinness of these layers (e.g., graphene and hexagonal boron nitride) is suited to coat any type of metal substrate surfaces due to its mechanical flexibility. Also, these layers can withhold the thermal heat during the substrate cleaning processes at about 500° C. due to their thermal stability. In addition, these layers provide a chemically inert surface for the photocathode growths based on their dangling bond-free atomic structure. Furthermore, these layers have suitable optical properties.

For example, an example material for the photocathodes is the potassium cesium antimonide ($K_2CsSb$), which possesses one of the highest QEs with a peak well exceeding 20% at 3 eV. It also does not require extremely high operating vacuum of about $10^{-11}$ torr as that of other photocathode materials (e.g., activated gallium arsenide (GaAs: Cs—O)). When an enhancement layer according to the present disclosure is utilized, an average QE enhancement of about relative 10% up to 80% from high QE bialkali antimonide $K_2CsSb$ photocathodes was achieved. The structure of coating an atomically (e.g., vanishingly) thin layer on reflective metal substrates serves as a milestone towards novel method to enhance QE of semiconductor photocathodes for accelerator technology.

The foregoing description of the preferred embodiments of the invention has been presented for purposes of illustration and description and is not intended to be exhaustive or to limit the claimed invention to the precise form disclosed. Those of skill in the art will readily appreciate that many modifications and variations to the claimed invention are possible in light of the above teaching. The embodiments were chosen and described in order to best explain the principles of the invention and its practical application to thereby enable others skilled in the art to best utilize the invention in various photocathode embodiments and with various modifications as are suited to the particular use contemplated. It is intended that the scope of the invention be defined exclusively by the following claims, and equivalents thereof.

We claim:

1. A photocathode assembly, comprising:
   a reflective substrate;
   an enhancement layer on the reflective substrate; and
   a photosensitive film on the enhancement layer,
   wherein the enhancement layer has a thickness of about 10 nm or less and the reflective substrate has a reflectivity of 50% or greater, and
   the enhancement layer is between the reflective substrate and the photosensitive film.

2. The photocathode assembly of claim 1, wherein the enhancement layer comprises one or more atomic layers of graphene sheet, hexagonal boron nitride, transition metal dichalcogenides, transition metal carbides, transition metal nitrides, or transition metal carbonitrides.

3. The photocathode assembly of claim 1, wherein the enhancement layer comprises a single atomic layer of graphene sheet, a single atomic layer of hexagonal boron nitride, a monolayer of transition metal dichalcogenides, a monolayer of transition metal carbides, a monolayer of transition metal nitrides, or a monolayer of transition metal carbonitrides.

4. The photocathode assembly of claim 1, wherein the reflective substrate comprises a material selected from stainless steel, Au, Al, Ag, W, Mo, Ni, Pt, Pd, Cu, Si, $SiO_2$, GaAs, and $Si_3N_4$.

5. The photocathode assembly of claim 1, wherein the photosensitive film is selected from a metal, a bi-alkali compound, a multi-alkali compound, an alkali-semiconductor alloy, an alkali-halide, an alkali bi-metallic alloy, polycrystalline diamond, and combinations thereof.

6. The photocathode assembly of claim 1, wherein the photosensitive film is selected from Cu, Ni, Mg, Y, Sm, Ba, Nb, Ca, Au, Mg—Ba, a bi-alkali compound, a multi-alkali compound, $K_2CsSb$, $Cs_3Sb$, KCsSb mixed with CsBr, $K_3Sb$, $Na_2KSb$, $Li_2CsSb$, $Cs_2Te$, CsTe mixed with CsBr, CsKTe, $K_2Te$, $Rb_2Te$, RbCsTe; CsI; CsI—Ge, GaAs, InGaAs, CsAu, RbAu, polycrystalline diamond, and combinations thereof.

7. The photocathode assembly of claim 1, further comprising a sealing layer on a side of the photosensitive film facing away from the enhancement layer.

8. The photocathode assembly of claim 7, wherein the sealing layer comprises a metal halide, SiOx, hexatricontane (HTC), and/or calcium stearate (CaSt).

9. A method for manufacturing a photocathode assembly, the method comprising:
   depositing an enhancement layer on a reflective substrate to form an enhancement layer-reflective substrate laminate, the enhancement layer has a thickness of about 10 nm or less; and
   depositing a photosensitive film on the enhancement layer-reflective substrate laminate to form a photosensitive film-enhancement layer-reflective substrate laminate,
   wherein the reflective substrate has a reflectivity of 50% or greater, and
   the enhancement layer is between the reflective substrate and the photosensitive film.

10. The method of claim 9, wherein the enhancement layer comprises one or more atomic layers of graphene sheet, hexagonal boron nitride, transition metal dichalcogenides, transition metal carbides, transition metal nitrides, or transition metal carbonitrides.

11. The method of claim 9, wherein the enhancement layer comprises a single atomic layer of graphene sheet, a single atomic layer of hexagonal boron nitride, a monolayer of transition metal dichalcogenides, a monolayer of transition metal carbides, a monolayer of transition metal nitrides, or a monolayer of transition metal carbonitrides.

12. The method of claim 9, wherein the reflective substrate comprises a material selected from stainless steel, Au, Al, Ag, W, Mo, Ni, Pt, Pd, Cu, Si, $SiO_2$ and $Si_3N_4$.

13. The method of claim 9, wherein the depositing of the enhancement layer is through chemical vapor deposition.

14. The method of claim 9, wherein the depositing of the enhancement layer comprises:
   depositing the enhancement layer on a carrier substrate to form an enhancement layer-carrier laminate;
   applying a polymer film on the enhancement layer to form a polymer film-enhancement layer-carrier laminate;
   removing the carrier substrate from the polymer film-enhancement layer-carrier laminate to form a polymer film-enhancement layer laminate;
   attaching the reflective substrate to the polymer film-enhancement layer laminate to form a polymer film-enhancement layer-reflective substrate laminate; and
   removing the polymer film from the polymer film-enhancement layer-reflective substrate laminate to form an enhancement layer-reflective substrate laminate.

15. The method of claim 9, further comprising depositing a sealing layer on the photosensitive film to form a sealing layer-photosensitive film-enhancement layer-reflective substrate laminate.

16. The method of claim 9, wherein the depositing of the photosensitive film on the enhancement layer-reflective substrate laminate comprises depositing the photosensitive film directly on the enhancement layer of the enhancement layer-reflective substrate laminate through chemical vapor deposition.

17. The method of claim 9, wherein the photosensitive film is selected from a metal, a bi-alkali compound, a multi-alkali compound, an alkali-semiconductor alloy, an alkali-halide, an alkali bi-metallic alloy, polycrystalline diamond, and combinations thereof.

18. A method for improving quantum efficiency of bialkali photocathodes, the method comprising:
depositing an enhancement layer on a reflective substrate to form an enhancement layer-reflective substrate laminate, the enhancement layer has a thickness of about 10 nm or less; and
depositing a photosensitive film on the enhancement layer-reflective substrate laminate to form a photosensitive film-enhancement layer-reflective substrate laminate,
wherein the reflective substrate has a reflectivity of 50% or greater, and
the enhancement layer is between the reflective substrate and the photosensitive film.

19. The method of claim 18, wherein the enhancement layer comprises one or more atomic layers of graphene sheet, hexagonal boron nitride, transition metal dichalcogenides, transition metal carbides, transition metal nitrides, or transition metal carbonitrides.

20. The method of claim 18, wherein an improvement in quantum efficiency is from about 10% to about 80% greater than a quantum efficiency of a corresponding bialkali photocathode without the enhancement layer.

* * * * *